United States Patent
Li et al.

(10) Patent No.: US 10,816,842 B2
(45) Date of Patent: Oct. 27, 2020

(54) ARRAY SUBSTRATE AND METHOD FOR MANUFACTURING THE SAME, LIQUID CRYSTAL DISPLAY PANEL, DISPLAY DEVICE

(71) Applicants: BOE Technology Group Co., Ltd., Beijing (CN); Chongqing BOE Optoelectronics Technology Co., Ltd., Chongqing (CN)

(72) Inventors: Peng Li, Beijing (CN); Zhe Li, Beijing (CN); Jaikwang Kim, Beijing (CN); Zhijian Qi, Beijing (CN); Keke Gu, Beijing (CN); Zhidan Sun, Beijing (CN); Xiaoji Li, Beijing (CN); Haoxiang Fan, Beijing (CN); Lan Xin, Beijing (CN); Junhong Lu, Beijing (CN); Xiaochen Cui, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 175 days.

(21) Appl. No.: 16/304,014

(22) PCT Filed: Feb. 12, 2018

(86) PCT No.: PCT/CN2018/076470
§ 371 (c)(1),
(2) Date: Nov. 21, 2018

(87) PCT Pub. No.: WO2019/007076
PCT Pub. Date: Jan. 10, 2019

(65) Prior Publication Data
US 2020/0201108 A1    Jun. 25, 2020

(30) Foreign Application Priority Data

Jul. 7, 2017  (CN) .................... 2017 1 0552949

(51) Int. Cl.
G02F 1/1333   (2006.01)
G02F 1/1335   (2006.01)
G02F 1/1362   (2006.01)

(52) U.S. Cl.
CPC .. *G02F 1/133345* (2013.01); *G02F 1/133512* (2013.01); *G02F 1/136286* (2013.01); *G02F 2001/136295* (2013.01)

(58) Field of Classification Search
CPC ......... G02F 1/133345; G02F 1/133512; G02F 1/136286; G02F 2001/136295
(Continued)

(56) References Cited

U.S. PATENT DOCUMENTS 6,697,138 B2   2/2004   Ha et al.
6,963,381 B2   11/2005  Kano et al.
(Continued)

FOREIGN PATENT DOCUMENTS

CN   1477433 A   2/2004
CN   1614480 A   5/2005
(Continued)

OTHER PUBLICATIONS

Office Action, including Search Report, for Chinese Patent Application No. 201710552949.6, dated Sep. 17, 2019, 16 pages.
(Continued)

*Primary Examiner* — Nathanael R Briggs
*Assistant Examiner* — William D Peterson
(74) *Attorney, Agent, or Firm* — Westman, Champlin & Koehler, P.A.

(57) ABSTRACT

An array substrate, a method for manufacturing the same, a liquid crystal display panel, and a display device are pro-
(Continued)

vided. The array substrate includes a first substrate, signal lines and an insulating layer; the insulating layer is disposed on the first substrate, and grooves are disposed on a side of the insulating layer facing away from the first substrate and disposed in a region of the insulating layer corresponding to a non-display region of the array substrate; and the signal lines are disposed on inner walls of the grooves, a direction of the inner walls of the grooves is arranged such that at least a portion of light incident on the signal lines from a side of the first substrate facing away from the signal lines is reflected to a display region of the array substrate.

16 Claims, 10 Drawing Sheets

(58) Field of Classification Search
USPC .......................................................... 349/110
See application file for complete search history.

(56) References Cited

U.S. PATENT DOCUMENTS

| | | | |
|---|---|---|---|
| 7,206,047 | B2 | 4/2007 | Hwang |
| 7,697,099 | B2 | 4/2010 | Kume et al. |
| 7,791,693 | B2 | 9/2010 | Lee et al. |
| 8,553,173 | B2 | 10/2013 | Hu et al. |
| 2002/0113927 | A1 | 8/2002 | Ha et al. |
| 2004/0017528 | A1 | 1/2004 | Kano et al. |
| 2005/0117108 | A1 | 6/2005 | Kume et al. |
| 2005/0140868 | A1 | 6/2005 | Hwang |
| 2008/0002117 | A1 | 1/2008 | Lee et al. |
| 2013/0016301 | A1 | 1/2013 | Hu et al. |
| 2016/0178959 | A1 | 6/2016 | Xu et al. |

FOREIGN PATENT DOCUMENTS

| | | | |
|---|---|---|---|
| CN | 1637546 A | | 7/2005 |
| CN | 101059612 A | | 10/2007 |
| CN | 101105595 A | | 1/2008 |
| CN | 101149517 A | * | 3/2008 |
| CN | 101149517 A | | 3/2008 |
| CN | 102269895 A | | 12/2011 |
| CN | 103135264 A | | 6/2013 |
| CN | 104536221 A | | 4/2015 |
| CN | 107132687 A | | 9/2017 |
| KR | 10-2008-0003103 A | | 1/2008 |

OTHER PUBLICATIONS

English translation of International Search Report and Box V of Written Opinion for International Application No. PCT/CN2018/076470, dated Apr. 27, 2018, 6 pages.

* cited by examiner

ARRAY SUBSTRATE AND METHOD FOR MANUFACTURING THE SAME, LIQUID CRYSTAL DISPLAY PANEL, DISPLAY DEVICE

CROSS-REFERENCE TO RELATED APPLICATION

The present application is a Section 371 National Stage application of International Application No. PCT/CN2018/076470, filed on 12 Feb. 2018, which has not yet published, and claims priority to Chinese Patent Application No. 201710552949.6 filed on Jul. 7, 2017 in the State Intellectual Property Office of China, the disclosures of which are incorporated herein by reference.

TECHNICAL FIELD

The present disclosure relates to a field of display technologies, and in particular, to an array substrate and a method for manufacturing the same, a liquid crystal display panel and a display device.

BACKGROUND

A liquid crystal display panel of a liquid crystal display has a display region and a non-display region. In order to prevent a light leakage in the non-display region, a black matrix layer is generally formed in the non-display region. When a backlight source is illuminating the liquid crystal display panel, light irradiated on the non-display region of the liquid crystal display panel may not be utilized, thereby causing a relatively low backlight utilization rate and a relatively low panel transmittance.

SUMMARY

The embodiments of the present disclosure provide an array substrate and a method for manufacturing the same, a liquid crystal display panel and a display device.

The embodiments of the present disclosure provide an array substrate comprising:

a first substrate, signal lines and an insulating layer;

the insulating layer is disposed on the first substrate, and grooves are disposed on a side of the insulating layer facing away from the first substrate and disposed in a region of the insulating layer corresponding to a non-display region of the array substrate;

and the signal lines are disposed on inner walls of the grooves, a direction of the inner walls of the grooves is arranged such that at least a portion of light incident on the signal lines from a side of the first substrate facing away from the signal lines is reflected to a display region of the array substrate.

In an embodiment, the signal lines comprises scan lines and data lines, the scan lines and the data lines being arranged to cross each other; the grooves comprise the first grooves and the second grooves;

wherein the insulating layer comprises a first insulating layer and a second insulating layer stacked to each other:

the first grooves are disposed on a side of the first insulating layer facing away from the first substrate and disposed in a region of the first insulating layer corresponding to a non-display region of the array substrate; and the scan lines are disposed on inner walls of the first grooves, a direction of the inner walls of the first grooves is arranged such that at least a portion of light incident on the scan lines from a side of the first substrate facing away from the scan lines is reflected to a display region of the array substrate; and the second grooves are disposed on a side of the second insulating layer facing away from the first substrate and disposed in a region of the second insulating layer corresponding to a non-display region of the array substrate; and the data lines are disposed on inner walls of the second grooves, a direction of the inner walls of the second grooves is arranged such that at least a portion of light incident on the data lines from a side of the first substrate facing away from the data lines is reflected to a display region of the array substrate.

In an embodiment, the signal lines cover the entire inner walls of the grooves.

In an embodiment, each of the inner walls of the grooves has a cross section of a substantial U or V shape.

In an embodiment, each of the grooves has a cross section of an isosceles triangle.

In an embodiment, each of the inner walls of the first grooves or the second grooves has a cross section of a substantial U or V shape.

In an embodiment, each of the first grooves or the second grooves has a cross section of an isosceles triangle.

The embodiments of the present disclosure also provide a liquid crystal display panel, comprising:

the array substrate mentioned above;

an opposite substrate aligned and assembled with the array substrate; and a liquid crystal layer disposed between the array substrate and the opposite substrate.

In an embodiment, the opposite substrate comprises: a second substrate, a black matrix layer disposed on a surface of the second substrate facing toward the array substrate and in a region corresponding to the non-display region of the array substrate; each of the grooves has a cross section of an isosceles triangle, and an apex angle of the isosceles triangle is $\theta_1$ which satisfies the following condition:

$$L_{1min}/d_{1max} < \tan\theta_1 < L_{1max}/d_{1min}$$

where $L_{1min}$ is a distance from a vertex of the apex angle of the isosceles triangle to a proximal end of an adjacent pixel unit; $L_{1max}$ is a distance from a vertex of a base angle of the isosceles triangle to a distal end the adjacent pixel unit on a same side as the vertex of the base angle; $d_{1min}$ is a distance from the vertex of the base angle of the isosceles triangle to the black matrix layer; $d_{1max}$ is a distance from the vertex of the apex angle of the isosceles triangle to the black matrix layer.

In an embodiment, the opposite substrate comprises: a second substrate, a black matrix layer disposed on a surface of the second substrate facing toward the array substrate and in a region corresponding to the non-display region of the array substrate; each of the grooves has a cross section of an isosceles triangle, and the apex angle of the isosceles triangle is $\theta_1$ which satisfies the following condition:

$$L'_{1min}/d_{1min} < \tan\theta_1 < L'_{1max}/d_{1max}$$

where $L'_{1min}$ is a distance from a vertex of a base angle of the isosceles triangle to a proximal end of an adjacent pixel unit on a same side of the vertex of the base angle; $L'_{1max}$ is a distance from a vertex of the apex angle of the isosceles triangle to a distal end of the adjacent pixel unit; $d_{1min}$ is a distance from the vertex of the base angle of the isosceles triangle to the black matrix layer; $d_{1max}$ is a distance from the vertex of the apex angle of the isosceles triangle to the black matrix layer.

The embodiments of the present disclosure also provide a display device, comprising the liquid crystal display panel mentioned above.

The embodiments of the present disclosure also provide a method for manufacturing an array substrate, comprising steps of:

forming an insulating layer on one side of a first substrate, and forming grooves on a side of the insulating layer facing away from the first substrate and in a region corresponding to a non-display region of the array substrate;

forming signal lines on inner walls of the grooves, arranging a direction of the inner walls of the grooves such that at least a portion of light incident to the signal lines from a side of the first substrate facing away from the signal lines is reflected to a display region of the array substrate.

In an embodiment, the signal lines comprises scan lines and data lines, the scan lines and the data lines being arranged to cross each other; the grooves comprise the first grooves and the second grooves and the insulating layer comprises a first insulating layer and a second insulating layer stacked to each other; and the method includes following steps:

forming a first insulating layer on one side of the first substrate, and forming first grooves on a side of the first insulating layer facing away from the first substrate and in a portion of the first insulating layer corresponding to the non-display region of the array substrate;

forming scan lines on inner walls of the first grooves, arranging a direction of inner walls of the first grooves such that at least a portion of light incident to the scan lines from a side of the first substrate facing away from the scan lines is reflected to a display region of the array substrate;

forming a second insulating layer on one side of the first insulating layer facing away from the first substrate, and forming second grooves on a side of the second insulating layer facing away from the first substrate and in a region corresponding to the non-display region of the array substrate; and forming a data lines on inner walls of the second grooves, arranging a direction of inner walls of the second grooves such that at least a portion of light incident to the data lines from a side of the first substrate facing away from the data lines is reflected to the display region of the array substrate.

In an embodiment, the step of forming an insulating layer on one side of the first substrate, and forming grooves on a side of the insulating layer facing away from the first substrate and in a region corresponding to a non-display region of the array substrate, comprises:

applying a negative photoresist on one side of the first substrate;

exposing and developing the negative photoresist with a halftone mask to form an insulating layer, and forming grooves on a side of the insulating layer facing away from the first substrate and in a portion of the insulating layer corresponding to the non-display region of the array substrate.

In an embodiment, the step of forming a first insulating layer on one side of the first substrate, and forming first grooves on a side of the first insulating layer facing away from the first substrate and in a portion of the first insulating layer corresponding to the non-display region of the array substrate comprises:

applying a negative photoresist on one side of the first substrate;

exposing and developing the negative photoresist with a halftone mask to form a first insulating layer, and forming first grooves on a side of the first insulating layer facing away from the first substrate and in a portion of the first insulating layer corresponding to the non-display region of the array substrate.

In an embodiment, the step of forming a second insulating layer on one side of the first insulating layer facing away from the first substrate, and forming second grooves on a side of the second insulating layer facing away from the first substrate and in a portion of the second insulating layer corresponding to the non-display region of the array substrate comprises:

applying a negative photoresist on one side of the first insulating layer facing away from the first substrate;

exposing and developing the negative photoresist with a halftone mask to form a second insulating layer, and forming second grooves on a side of the second insulating layer facing away from the first substrate and in a portion of the second insulating layer corresponding to the non-display region of the array substrate.

DETAILED DESCRIPTION OF EMBODIMENTS

Figure 1:
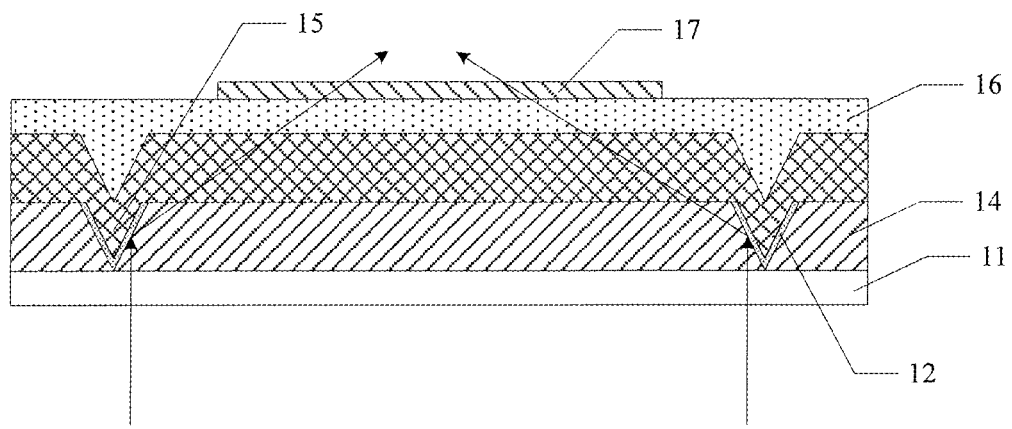
FIG. 1 is a schematic structural diagram of an array substrate provided by an embodiment of the present disclosure.

Unless otherwise defined, technical terms or scientific terms used in the present disclosure should be understood in the ordinary meaning of the ordinary skill of ordinary skill in the art. The words "first," "second," and similar terms used in the present disclosure do not denote any order, quantity, or importance, but are used to distinguish different components. The term "vertical" or "horizontal" as used in this disclosure has a relative meaning rather than an absolute meaning, for example "vertical" may be understood to mean the first direction, and "horizontal" may be understood to mean the first direction A substantially vertical second direction. The words "including" or "comprising", and the like, are intended to mean that the elements or items that appear in the "Connected" or "connected" and the like are not limited to physical or mechanical connections, but may include electrical connections, whether direct or indirect. "Upper", "lower", "above", "below", "left", "right", etc. are only used to indicate the relative positional relationship. When the absolute position of the described object is changed, the relative positional relationship may also be changed correspondingly.

The same reference numerals indicate the same meanings in the embodiments of the present disclosure and the drawings, unless otherwise defined. Moreover, in the drawings of the embodiments of the present disclosure, only the structures involved in the embodiments of the present disclosure are presented, and other structures may refer to the general design. For the sake of clarity, the thickness of layers or regions is exaggerated in the figures used to describe embodiments of the present disclosure. It will be understood that when an element such as a layer, a film, a region or a substrate is referred to as being "on" or "under" another element, the element may be "directly"", or there may be intermediate components.

In the present disclosure, the "cross each other" of the scan lines and the data lines refers to a intersection of the projections of the scan lines and the data lines on the substrates, especially perpendicular to each other, which does not mean that the scan lines and the data lines are necessarily intersect themselves.

In the present disclosure, signal lines (e.g., scan lines or data lines) cover the "entire" inner walls of the grooves means that the inner walls of the grooves may be completely or substantially covered by the signal lines, such that the light incident on the signal lines is completely or mainly reflected thereby. However, the grooves are not necessarily completely filled with the signal lines.

In the present disclosure, each of the inner walls of the grooves may be two planes or curved surfaces intersecting each other. In other words, each of the inner walls of the grooves may be substantially "V" shaped or "U" shaped. In a condition that each of the inner walls of the grooves is two curved surfaces intersecting each other, each of the curved surfaces may be an arc surface or other curved surface, for example a paraboloid. The arc surface or paraboloid herein refers to a curved surface formed by translating a circular arc or a parabola. In a condition that each of the inner walls of the grooves consists of two intersecting curved surfaces, the two curved surfaces may form a smooth junction therebetween and thus form a single curved surface with no significant boundaries at their intersection.

In the present disclosure, the "cross section" of the groove refers to a section perpendicular to a direction in which a length of the groove extends.

In the present disclosure, the distance from a vertex of an apex angle of the isosceles triangle to "a proximal end of an adjacent pixel unit" refers to the distance between the projections of the vertex of the apex angle and the proximal end of the adjacent pixel electrode on a plane parallel to the array substrate. Similarly, the distance from a vertex of a base angle of the isosceles triangle to "a distal end of the adjacent pixel unit" on a same side of the vertex means the distance between the projections of the vertex of the base angle and the distal end of the adjacent pixel unit on the plane that is parallel to the array substrate. Further, the terms "proximal end" and "distal end" are defined with respect to the vertex.

Embodiments of the present disclosure provide an array substrate and a method for manufacturing the same, a liquid crystal display panel, and a display device, for at least partially improving backlight utilization rate and panel transmittance.

The technical solutions in the embodiments of the present disclosure are clearly and completely described in the following with reference to the accompanying drawings in the embodiments of the present disclosure. It is obvious that the described embodiments are only a part of the embodiments of the present invention, and not all of the embodiments. All other embodiments obtained by a person of ordinary skill in the art based on the embodiments of the present disclosure without departing from the inventive scope are the scope of the disclosure.

It should be noted that the thicknesses and shapes of the layers in the drawings of the present disclosure do not reflect a true proportions, and are merely intended to illustrate the present disclosure.

Figure 2:
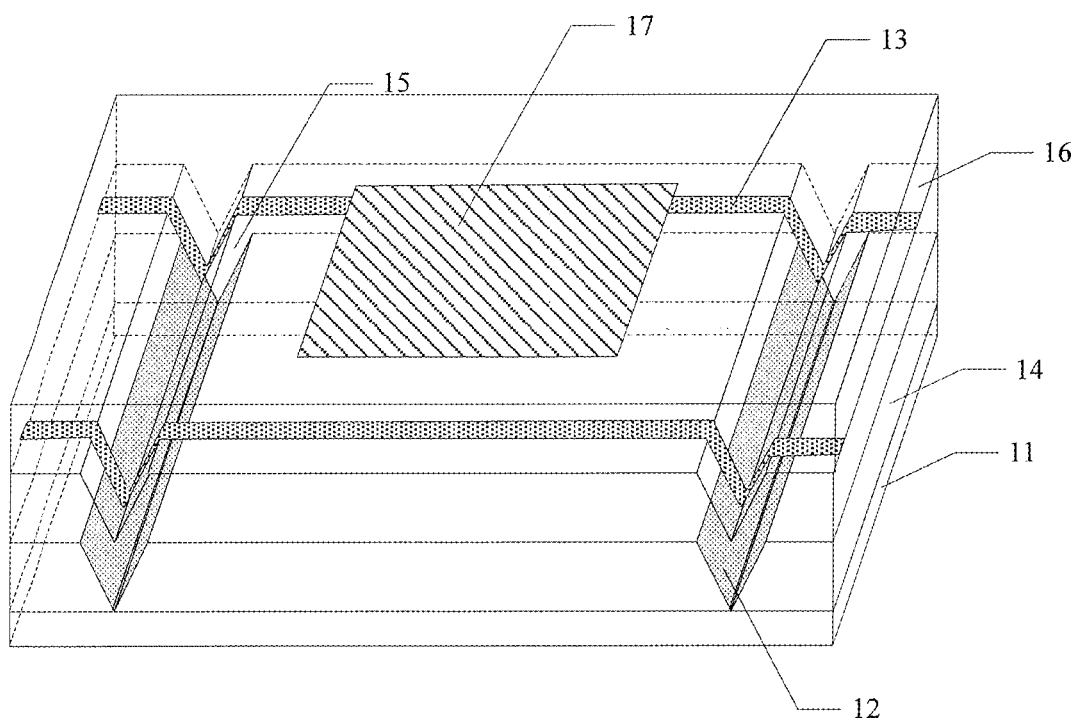
FIG. 2 is a perspective view of the array substrate provided by an embodiment of the present disclosure.

Referring to FIG. 1 and FIG. 2, an array substrate provided by an embodiment of the present disclosure includes: a first substrate 11, scan lines 12 and data lines 13 arranged to cross each other, over the region of the first substrate 11 corresponding to a non-display region of the array substrate. A first insulating layer 14 is disposed between the scan lines 12 and the first substrate 11. The first insulating layer 14 is provided with first grooves 15 each having an inclined inner wall, and the scan lines 12 are disposed on the inner walls of the first grooves 15. As such, at least a part of the light incident on the scanning lines 12 from a side of the first substrate 11 facing away from the scanning lines 12 (shown by a line with an arrow in FIG. 1) is reflected to a display region of the array substrate. In one example, each of the inner walls of the first grooves 15 is inclined toward the middle thereof, for example, substantially V-shaped or U-shaped.

Since the scan lines 12 may reflect at least part of the light incident thereon from the side of the first substrate 11 facing away from the scan lines 12 to the display region of the array substrate, the backlight utilization rate and the panel transmittance may be improved to some extent.

In one embodiment, in order to improve the backlight utilization rate and the panel transmittance, and to reduce a line resistance of the scan lines, as much as possible, as shown in FIG. 1 and FIG. 2, the scan lines 12 may be disposed to cover the entire inner walls of the first grooves 15. Alternatively, the scan lines 12 may also partially cover the inner walls of the first grooves 15.

In one embodiment, each of the inner walls of the first grooves 15 may be two planes intersecting each other.

In another embodiment, each of the inner walls of the first grooves 15 may be a curved surface.

It should be noted that the inner walls of the first grooves 15 only needs to be disposed such that the scanning lines 12 disposed thereon reflect at least part of the light incident on the inner walls to the display region of the array substrate. As for the specific shape, the embodiment of the present disclosure does not limit it and may set a shape flexibly according to actual needs.

In one embodiment, as shown in FIG. 2, each of the first grooves 15 has a cross section of an isosceles triangle. Of course, the cross section of each of the first grooves 15 is not limited to an isosceles triangle, and may be, for example, other triangle shape, semicircle shape, semi-ellipse shape, parabola shape, and the like.

In one embodiment, the array substrate further includes: thin film transistors; and the scan lines 12 are disposed in a same layer as the gates of the thin film transistors.

In one embodiment, as shown in FIG. 1 and FIG. 2, the array substrate further includes: a passivation layer 16 disposed on the thin film transistors, and pixel electrodes 17 disposed on the passivation layer 16; the pixel electrodes 17 and the drains of the thin film transistors are electrically connected, and the pixel electrodes 17 are located in the display region of the array substrate. Any two adjacent scan lines 12 and any two adjacent data lines 13 cooperatively define one pixel unit, and a corresponding one of the pixel electrodes 17 is disposed in said one pixel unit as shown in FIG. 3.

It should be noted that the embodiment of the present disclosure is described by taking the data lines 13 being over the scan lines 12 as an example. However, the embodiment of the present disclosure is not limited thereto, and the data lines 13 may also be located below the scan lines 12, and the embodiments of the present disclosure does not limit the structure of the thin film transistors in the above array substrate, and thin film transistors of various structures are applicable.

Figure 3:
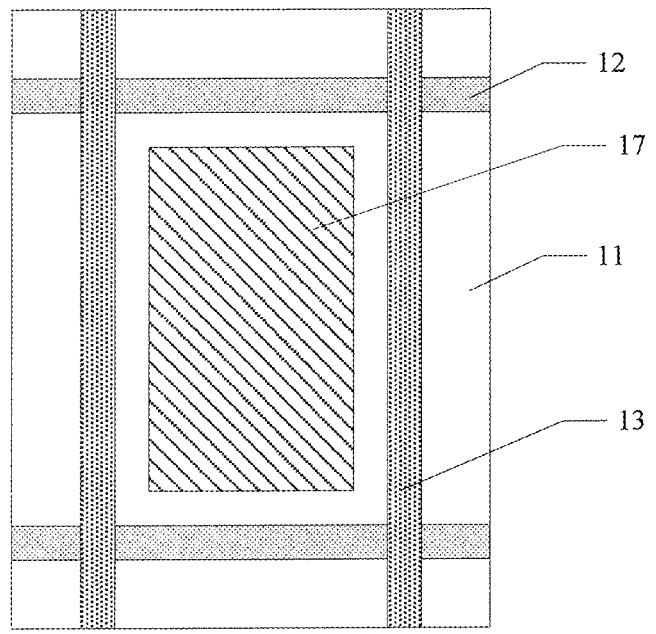
FIG. 3 is a top view of the array substrate provided by an embodiment of the present disclosure.
Figure 4:
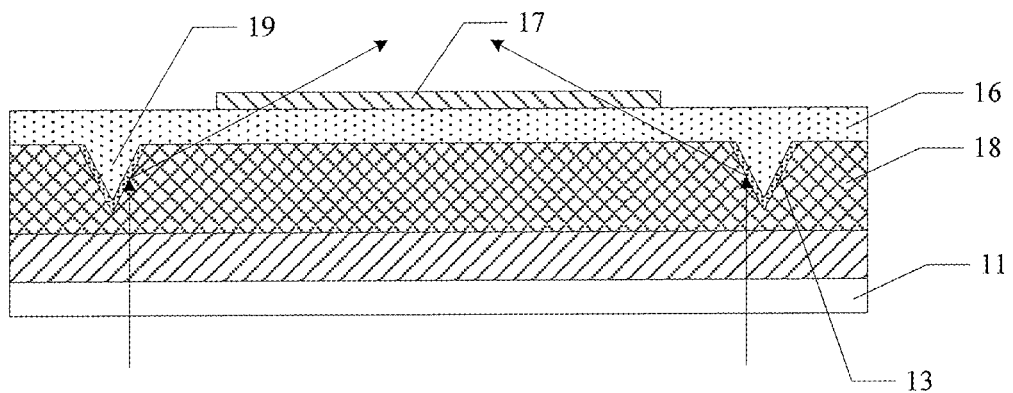
FIG. 4 is a schematic structural diagram of another array substrate provided by an embodiment of the present disclosure.
Figure 5:
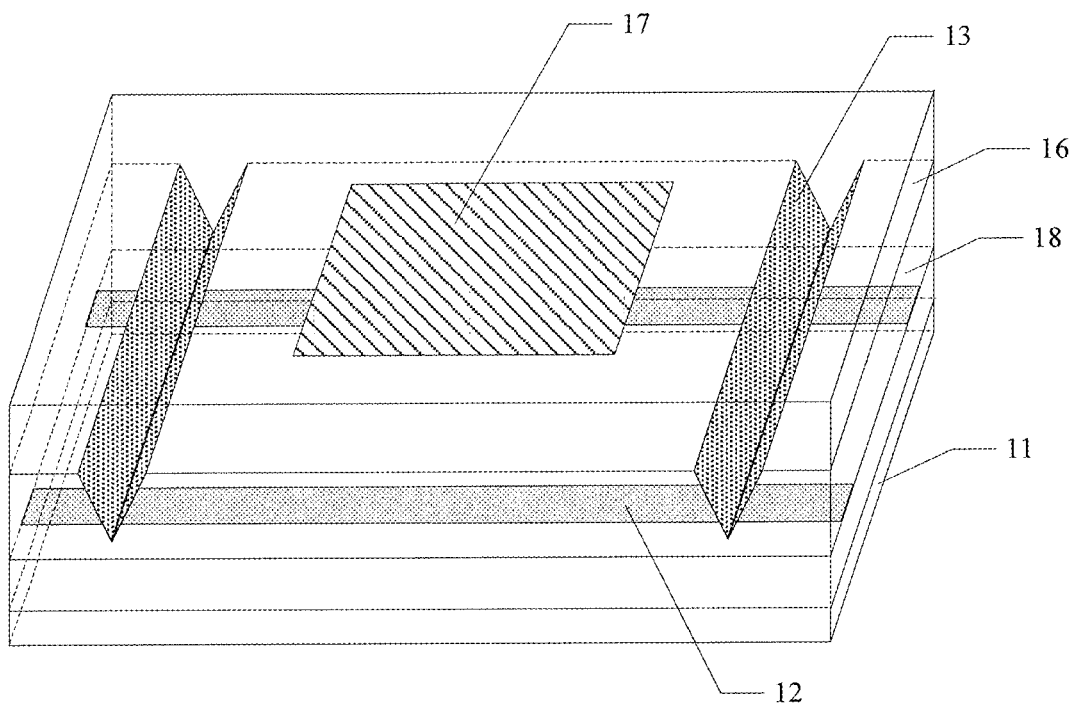
FIG. 5 is a perspective view of the another array substrate provided by an embodiment of the present disclosure.

The array substrate of the embodiments of the present disclosure shown in FIG. 4 and FIG. 5 is similar to the array substrate of the embodiment of the present disclosure shown in FIGS. 1-3, and same portions are not described herein again. Only different portions will be described below.

Referring to FIG. 4 and FIG. 5, the arrangement of the scan lines 12 in the array substrate provided by the embodiment of the present disclosure may be provided as needed, but a second insulating layer 18 is further disposed between the data lines 13 and the first substrate 11. Second grooves 19 each having an inclined inner wall are disposed in the second insulating layer 18, and the data lines 13 are disposed on the inner walls of the second grooves 19 such that at least a portion of the light incident on the data lines 13 from the side of the first substrate 11 facing away from the data lines 13 is reflected to the display region of the array substrate.

Since the data lines 13 may reflect at least a portion of the light incident thereon to the display region of the array substrate, the backlight utilization rate and the panel transmittance may also be improved to some extent.

In one embodiment, in order to increase the backlight utilization rate and the panel transmittance, and to reduce the lines resistance of the data lines, as much as possible, as shown in FIGS. 4 and 5, the data lines 13 may be disposed to cover the entire inner walls of the second grooves 19. Alternatively, the data lines 13 may also partially cover the inner walls of the second grooves 19.

In one embodiment, each of the inner walls of the second grooves 19 may be two planes intersecting each other.

In another embodiment, each of the inner walls of the second grooves 19 may be a curved surface.

It should be noted that the inner walls of the second grooves 19 may be set such that the data lines 13 disposed thereon may reflect at least a portion of the light incident thereon to the display region of the array substrate. As for the specific shape thereof, the embodiment of the present disclosure does not apply any restriction thereon and may set a shape flexibly depending on actual needs.

In one embodiment, as shown in FIG. 4, each of the second grooves 19 has a cross section of an isosceles triangle. Of course, the cross section of each of the second grooves 19 is not limited to an isosceles triangle, and may be, for example, other triangle shape, semicircle shape, semi-ellipse shape, parabola shape, and the like.

In one embodiment, the data lines 13 are disposed in a same layer as the sources and drains of the thin film transistors.

Figure 6:
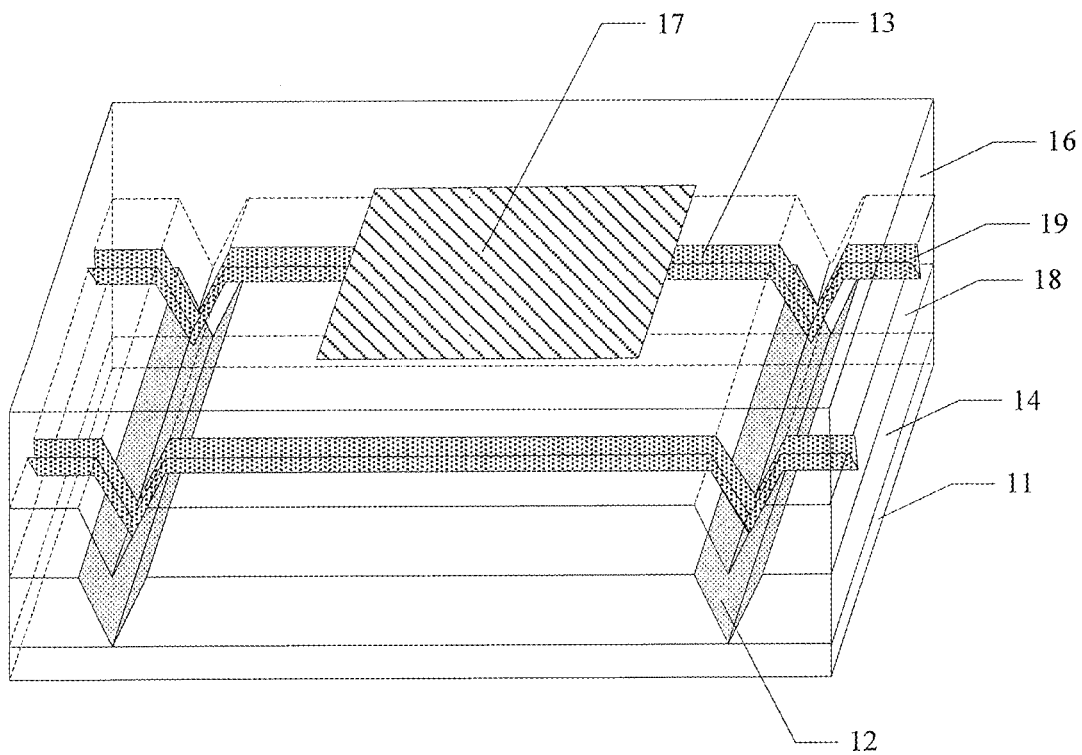
FIG. 6 is a perspective view of yet another array substrate provided by an embodiment of the present disclosure.

The array substrate of the embodiment of the present disclosure shown in FIG. 6 is similar to the array substrate of the embodiment of the present disclosure shown in FIG. 4 and FIG. 5, and same portions are not described herein again. Only different portions will be described below.

Referring to FIG. 6, the data lines 13 in the array substrate provided by the embodiment of the present disclosure adopt the structure of the data lines 13 in the array substrate shown in FIG. 4 and FIG. 5 and are disposed on the inner walls of the second grooves 19. The scan lines 12 adopt the structure of the scan lines 12 in the array substrate provided by the embodiment of the present disclosure shown in FIG. 1-2, and the scan lines 12 are disposed on the inner walls of the first grooves.

Figure 7:
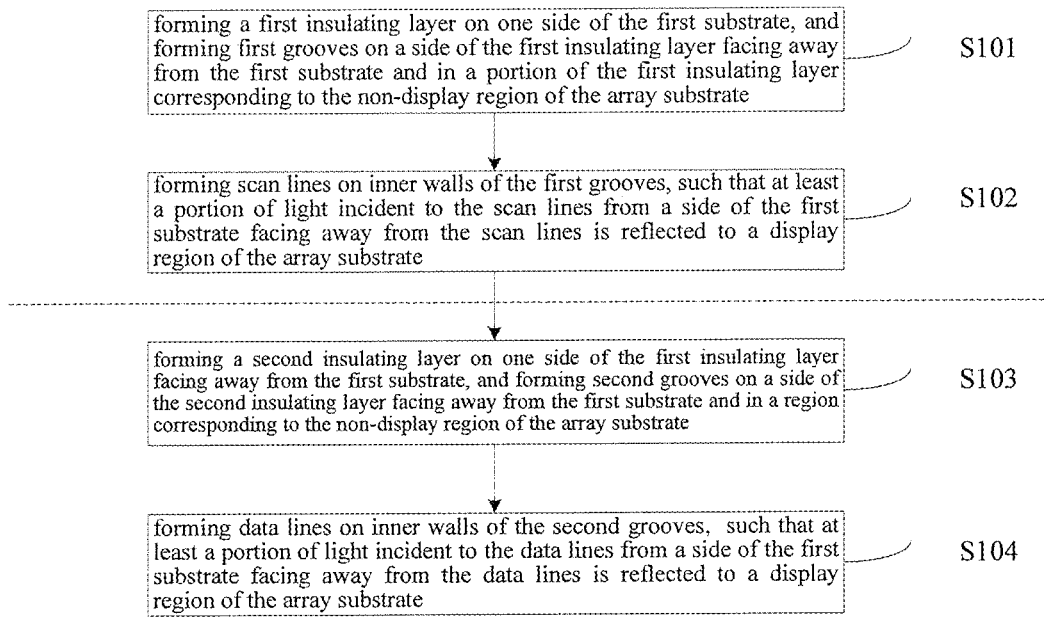
FIG. 7 is a schematic flow chart of a method for manufacturing an array substrate provided by an embodiment of the present disclosure.

Based on the same concept, referring to FIG. 7, an embodiment of the present disclosure further provides a method for manufacturing an array substrate, including following steps:

S101 forming a first insulating layer on one side of the first substrate, and forming first grooves on a side of the first insulating layer facing away from the first substrate and in a portion of the first insulating layer corresponding to the non-display region of the array substrate;

S102 forming scan lines on inner walls of the first grooves, arranging a direction of inner walls of the first grooves such that at least a portion of light incident to the scan lines from a side of the first substrate facing away from the scan lines is reflected to a display region of the array substrate; and/or S103 forming a second insulating layer on one side of the first insulating layer facing away from the first substrate, and forming second grooves on a side of the second insulating layer facing away from the first substrate and in a region corresponding to the non-display region of the array substrate;

S104 forming data lines on inner walls of the second grooves, arranging a direction of inner walls of the second grooves such that at least a portion of light incident to the data lines from a side of the first substrate facing away from the data lines is reflected to a display region of the array substrate; wherein the scan lines and the data lines are arranged to intersect each other in the array substrate.

If the array substrate shown in FIG. 1 and FIG. 2 is to be manufactured, the method for manufacturing the array substrate includes steps S101 and S102. If the array substrate shown in FIG. 4 and FIG. 5 is to be manufactured, the method for manufacturing the array substrate includes the steps. S103 and S104; if an array substrate as shown in FIG. 6 is to be manufactured, the method for manufacturing the array substrate includes steps S101, S102, S103 and S104.

It should be noted that a sequence of steps S101 and S102 and steps S103 and S104 is related to the structure of the fabricated array substrate. If the data lines are above the scan lines, steps S103 and S104 are performed after steps S101 and S102. If the data lines are below the scan lines, and steps S103 and S104 are performed before steps S101 and S102.

In one embodiment, the step S101 of forming a first insulating layer on one side of the first substrate, and forming first grooves in a portion of the first insulating layer corresponding to the non-display region of the array substrate, comprises:

applying a negative photoresist on one side of the first substrate;

exposing and developing the negative photoresist with a halftone mask (etching or the like may also utilized if necessary) to form an first insulating layer, and forming first grooves with inclined inner walls on a side of the first insulating layer facing away from the first substrate and in a portion of the first insulating layer corresponding to the non-display region of the array substrate.

The light transmittance of a shielding portion of the halftone mask may be set to gradually decrease from both sides thereof to the middle thereof, and the shape of the first grooves may be controlled by controlling the light transmittance of the shielding portion of the halftone mask.

In one embodiment, in the step S103 of forming a second insulating layer on one side of the first insulating layer, and forming second grooves with inclined inner walls on a side of the second insulating layer facing away from the first substrate and in a portion of the second insulating layer corresponding to the non-display region of the array substrate, comprises:

applying a negative photoresist on one side of the first insulating layer;

exposing and developing the negative photoresist with a halftone mask (etching or the like may also utilized if necessary) to form a second insulating layer, and forming second grooves with inclined inner walls on a side of the second insulating layer facing away from the first substrate and in a portion of the second insulating layer corresponding to the non-display region of the array substrate.

The light transmittance of the shielding portion of the halftone mask may be set to gradually decrease from both sides thereof to the middle thereof, and the shape of the second grooves may be controlled by controlling the light transmittance of the shielding portion of the halftone mask.

The manufacturing process of the array substrate provided by the embodiment of the present disclosure shown in FIG. 6 is specifically described below with reference to FIGS. 8(a)~8(i).

Figure 8A:
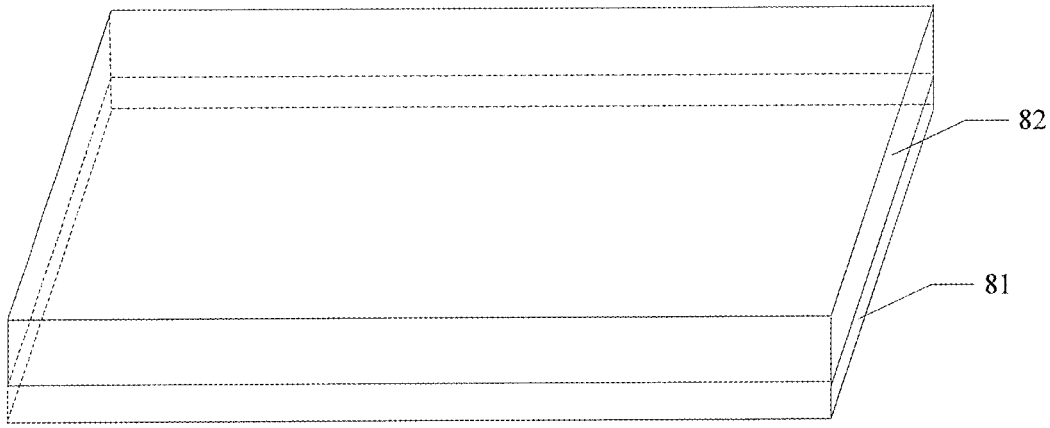
FIG. 8(a)~8(i) are schematic diagrams showing a process flow for manufacturing an array substrate provided by an embodiment of the present disclosure.
Figure 8B:
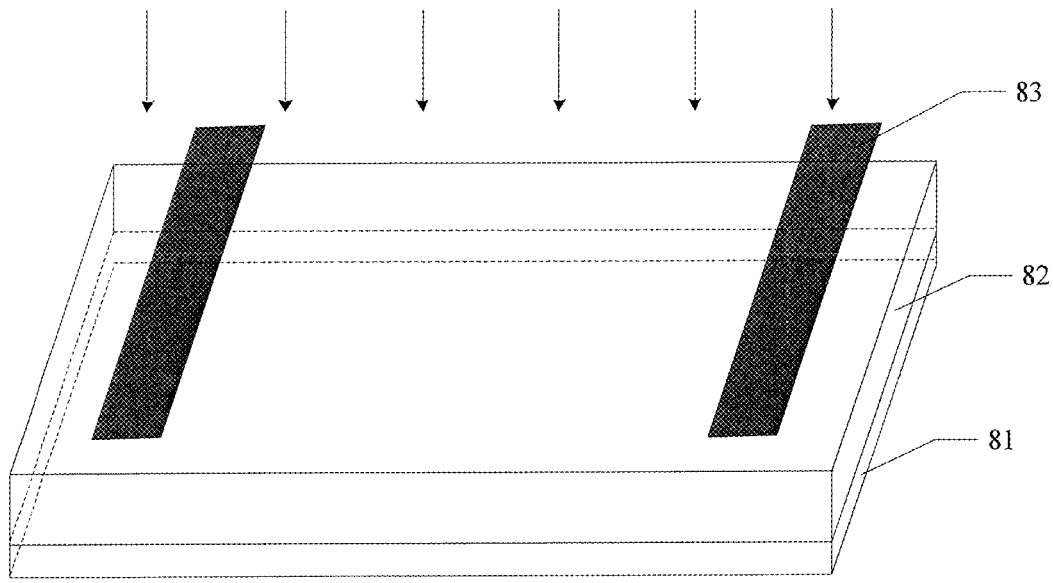
Figure 8C:
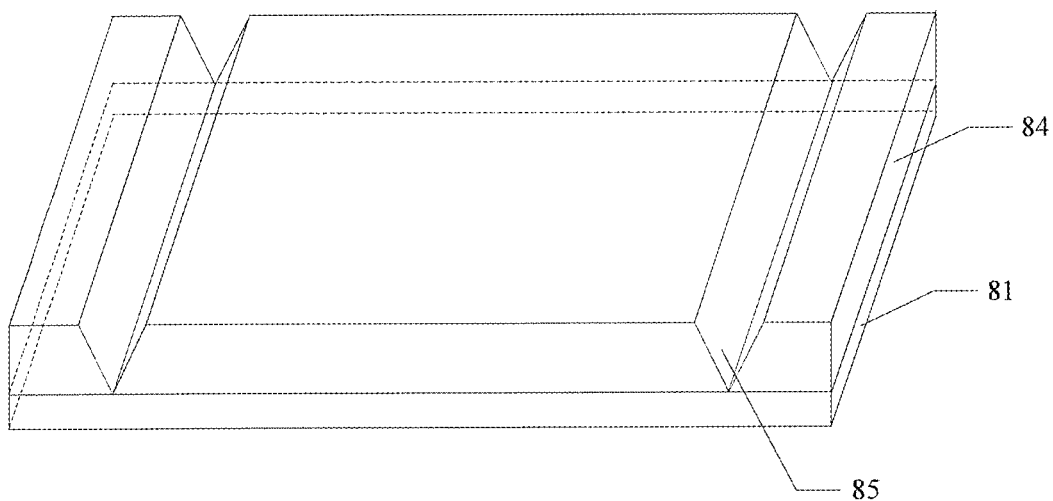
Figure 8D:
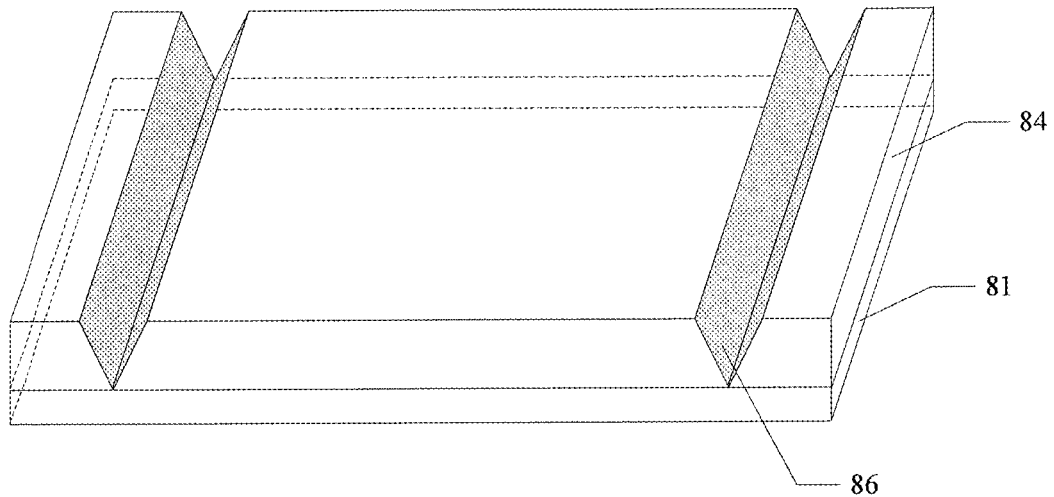
Figure 8E:
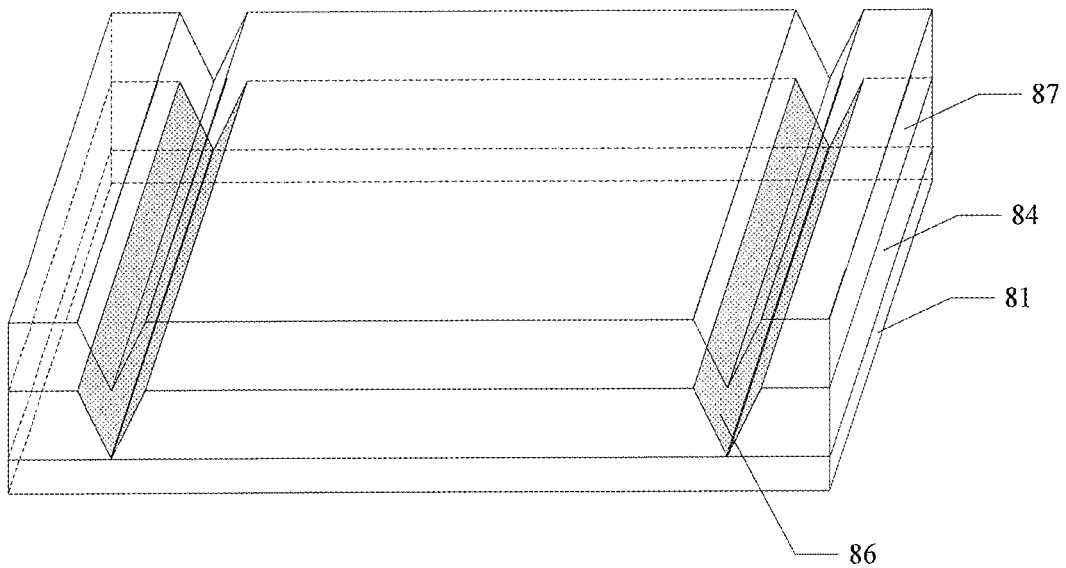
Figure 8F:
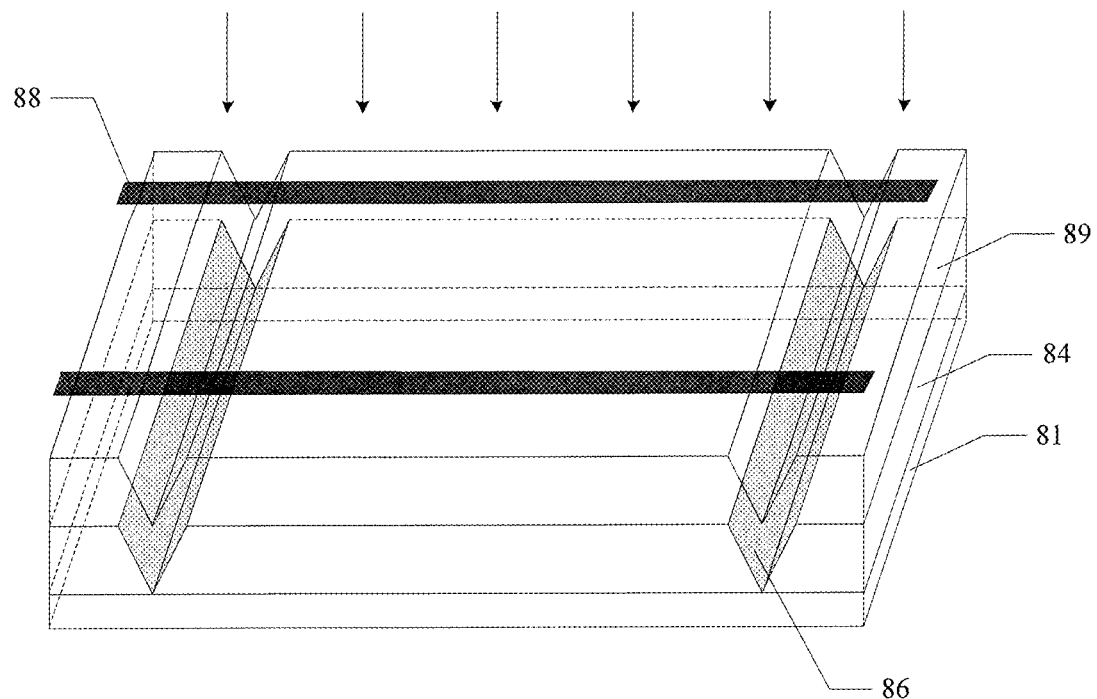
Figure 8G:
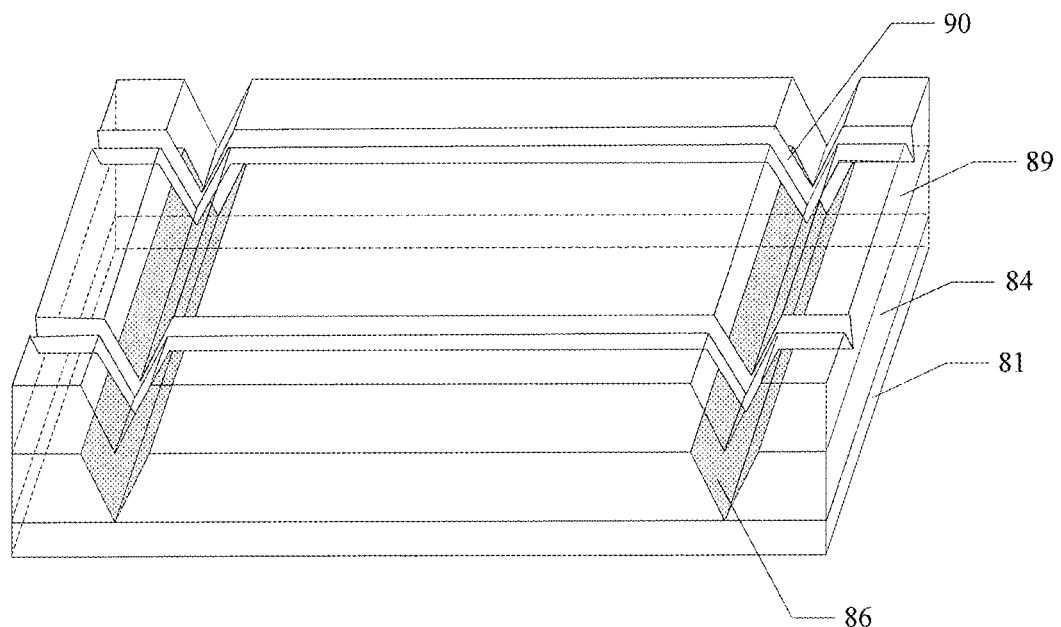
Figure 8H:
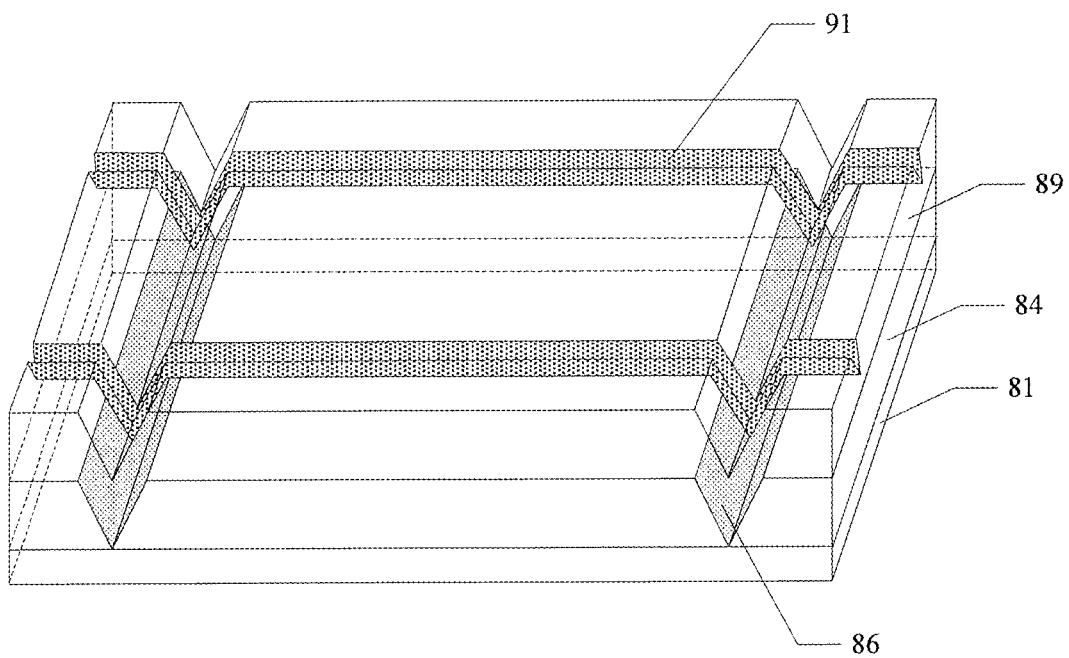

Step 1, refer to FIG. 8(a), applying a first negative photoresist 82 on the first substrate 81;

Step 2, referring to FIGS. 8(b) and 8(c), exposing and developing the first negative photoresist 82 with a first halftone mask 83 to form the first insulating layer 84, and forming first grooves 85 each of which has a inclined inner wall and has a cross section of an isosceles triangle in a portion of the first insulating layer 84 corresponding to the non-display region of the array substrate;

Step 3, referring to FIG. 8(d), forming scan lines 86 on the inner walls of the first grooves 85, the scan lines are configured such that at least a portion of light incident to the scan lines 86 from a side of the first substrate 81 facing away from the scan lines 86 is reflected to a display region of the array substrate;

Step 4, referring to FIG. 8(e), applying a second negative photoresist 87 on the first substrate 81 on which the scan lines 86 are formed;

Step 5, referring to FIGS. 8(f) and 8(g), exposing and developing the second negative photoresist 87 with a second halftone mask 88 to form a second insulating layer 89, and forming second grooves 90 each of which has a inclined inner wall and has a cross section of an isosceles triangle in a portion of the second insulating layer 89 corresponding to the non-display region of the array substrate;

Step 6, referring to FIG. 8(h), forming data lines 91 on the inner walls of the second grooves 90, and the data lines are configured such that at least a portion of light incident to the data lines 91 from a side of the first substrate 81 facing away from the data lines 91 is reflected to the display region of the array substrate; and the scan lines 86 and the data lines 91 are arranged to intersect each other.

Figure 8I:
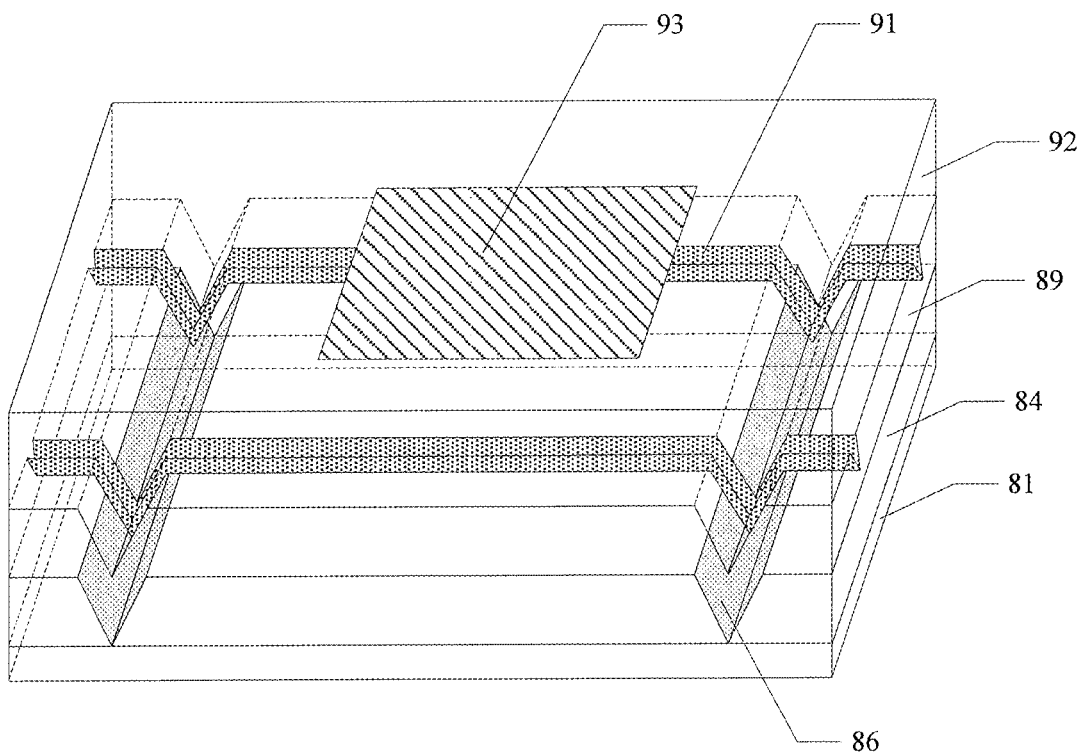

Step 7, referring to FIG. 8(i), a passivation layer 92 and a corresponding pixel electrode 93 are sequentially formed on the first substrate 81 on which the data lines 91 are formed.

It should be noted that, in the process of manufacturing the array substrate, the step of manufacturing the thin film transistors may further be included, and a preparation step of the thin film transistors may be selected according to requirements, and details are not described herein again, and the gates of the thin film transistors may be prepared while manufacturing the scan lines 86. The sources and drains of the thin film transistors may be prepared while manufacturing the data lines 91. In addition, in the steps 2 and 5 of forming the insulating layers, the first insulating layer and the second insulating layer are formed with the negative photoresist itself, or the materials thereof are the same. However, the method of forming the first or second insulating layer and forming the first or second grooves thereon respectively is not limited to the above steps, for example, it may be prepared by forming an insulating material layer on one side of the first substrate above all, applying a photoresist on the insulating material layer, and forming the first grooves or the second grooves as needed at a desired position of the insulating material layer by a process such as exposure, development, and etching and the like. In this case, the material of the insulating material layer and the material of the photoresist are different.

Based on the same concept, referring to FIG. 9 to FIG. 12, an embodiment of the present disclosure further provides a liquid crystal display panel, including: the array substrate 21 provided by any embodiment of the present disclosure, an opposite substrate 22 aligned and assembled to the array substrate 21, and a liquid crystal layer 23 disposed between the array substrate 21 and the opposite substrate 22.

The liquid crystal display panel mentioned above may be any mode of liquid crystal display panel, such as a liquid crystal display panel of a twisted nematic (TN) mode, a liquid crystal display panel of an In Plane Switching (IPS) mode, a liquid crystal display panel of an Advanced Super Dimension Switch (ADS) mode.

In one embodiment, as shown in FIG. 9 to FIG. 12, the opposite substrate 22 includes: a second substrate 221, a black matrix layer 222 disposed on a surface of the second substrate 221 facing toward the array substrate and in a region corresponding to the non-display region of the array substrate.

Figure 9:
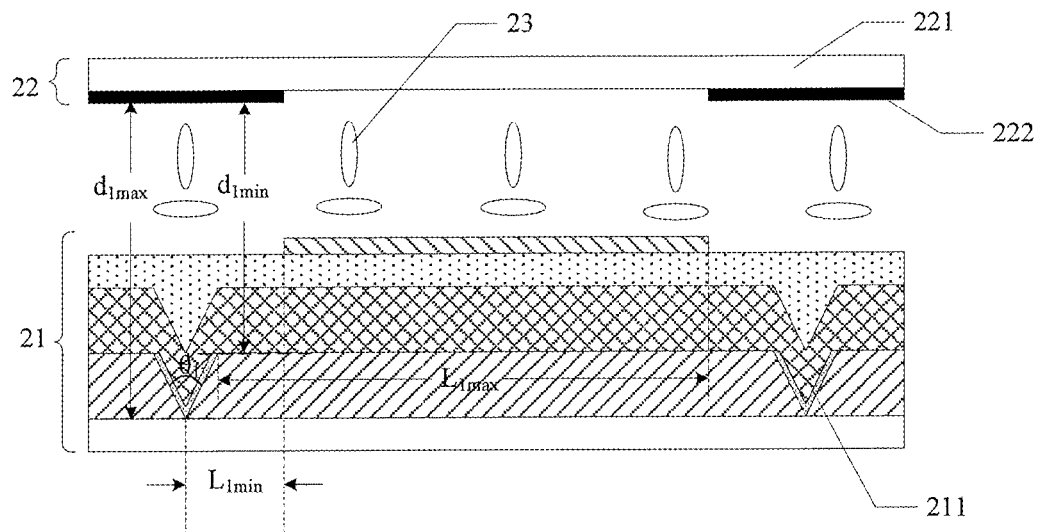
FIGS. 9 and 10 are schematic structural diagrams of a liquid crystal display panel provided by an embodiment of the present disclosure.

In one embodiment, as shown in FIG. 9, each first groove 211 of the array substrate 21 has a cross section of an isosceles triangle, and an apex angle of the isosceles triangle is $\theta_1$, and $\theta_1$ satisfies the following conditions:

$$L_{1min}/d_{1max} < \tan \theta_1 < L_{1max}/d_{1min}$$

where $L_{1min}$ is a distance from a vertex of the apex angle of the isosceles triangle to a proximal end of an adjacent pixel unit; $L_{1max}$ is a distance from a vertex of a base angle of the isosceles triangle to a distal end the adjacent pixel unit on a same side as the vertex of the base angle; $d_{1min}$ is a distance from the vertex of the base angle of the isosceles triangle to the black matrix layer 222; $d_{1max}$ is a distance from the vertex of the apex angle of the isosceles triangle to the black matrix layer 222.

Figure 10:
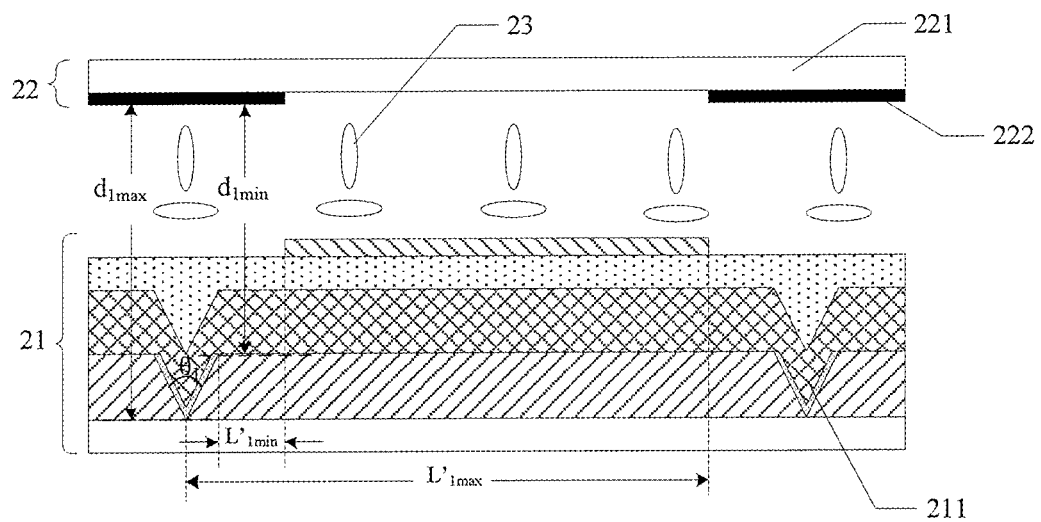

In one embodiment, as shown in FIG. 10, in order to reflect light incident on the scan lines to the display region of the array substrate as much as possible, $\theta_1$ may be set to satisfy the following conditions:

$$L'_{1min}/d_{1min} < \tan \theta_1 < L'_{1max}/d_{1max}$$

where $L'_{1min}$ is a distance from a vertex of a base angle of the isosceles triangle to a proximal end of the adjacent pixel unit on the same side of the vertex of the base angle; $L'_{1max}$ is a distance from a vertex of the apex angle of the isosceles triangle to a distal end of the adjacent pixel unit.

Figure 11:
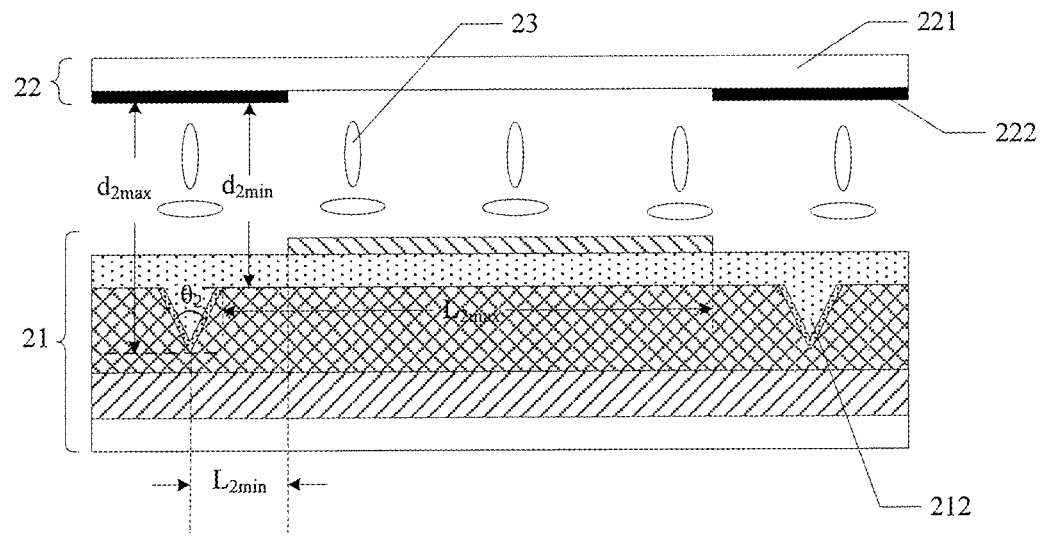
FIGS. 11 and 12 are schematic structural diagrams of another liquid crystal display panel provided by an embodiment of the present disclosure.

In one embodiment, as shown in FIG. 11, each second groove 212 of the array substrate 21 has a cross section of an isosceles triangle, and an apex angle of the isosceles triangle is $\theta_2$, and $\theta_2$ satisfies the following conditions:

$$L_{2min}/d_{2max} < \tan \theta_2 < L_{2max}/d_{2min}$$

where $L_{2min}$ is a distance from a vertex of the apex angle of the isosceles triangle to a proximal end of an adjacent pixel unit; $L_{2max}$ is a distance from a vertex of a base angle of the isosceles triangle to a distal end the adjacent pixel unit on a same side as the vertex of the base angle; $d_{2min}$ is a distance from the vertex of the base angle of the isosceles triangle to the black matrix layer 222; $d_{2max}$ is a distance from the vertex of the apex angle of the isosceles triangle to the black matrix layer.

Figure 12:
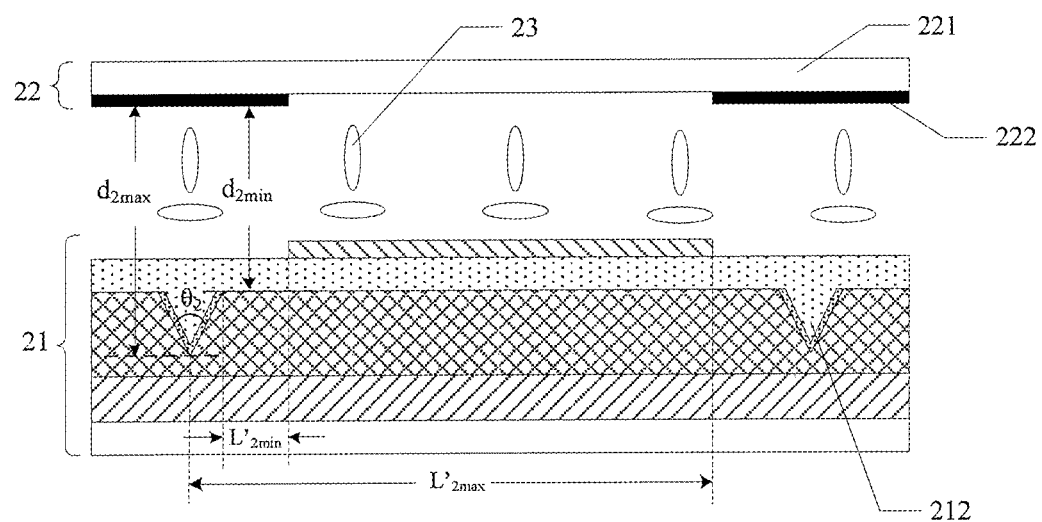

In one embodiment, as shown in FIG. 12, in order to reflect light incident on the data lines to the display region of the array substrate as much as possible, $\theta_2$ may be set to satisfy the following conditions:

$$L'_{2min}/d_{2min} < \tan \theta_1 < L'_{2max}/d_{2max}$$

where $L'_{2min}$ is a distance from a vertex of a base angle of the isosceles triangle to a proximal end of the adjacent pixel unit on the same side of the vertex of the base angle; $L'_{2max}$ is a distance from a vertex of the apex angle of the isosceles triangle to a distal end of the adjacent pixel unit.

Based on the same concept, an embodiment of the present disclosure further provides a display device, including the liquid crystal display panel provided by any embodiment of the present disclosure. The display device may be any product or component having a display function, such as a mobile phone, a tablet computer, a television, a display, a notebook computer, a digital photo frame, a navigator and the like.

In summary, in the technical solution provided by the embodiment of the present disclosure, the array substrate includes: a first substrate, signal lines and an insulating layer; the insulating layer is disposed on the first substrate, and grooves are disposed on a side of the insulating layer facing away from the first substrate and disposed in a region of the insulating layer corresponding to a non-display region of the array substrate; and the signal lines are disposed on inner walls of the grooves, a direction of the inner walls of the grooves is arranged such that at least a portion of light incident on the signal lines from a side of the first substrate facing away from the signal lines is reflected to a display region of the array substrate. Since the signal lines may reflect at least a portion of the light incident thereon to the display region of the array substrate, the backlight utilization rate and the panel transmittance may be improved to some extent.

In one embodiment, the signal lines cover the entire inner walls of the grooves. In this way, on one hand, the light incident on the signal lines may be reflected to the display region of the array substrate as much as possible, thereby improving the backlight utilization rate and the panel transmittance as much as possible; and on the other hand, an effective line width of each of the signal lines may be increased to some extent, thereby reducing a line resistance of each of the signal lines.

A liquid crystal display panel according to an embodiment of the present disclosure includes the above array substrate, an opposite substrate aligned and assembled with the array substrate; and a liquid crystal layer disposed between the array substrate and the opposite substrate, wherein the array substrate includes: a first substrate, signal lines and an insulating layer; the insulating layer is disposed on the first substrate, and grooves are disposed on a side of the insulating layer facing away from the first substrate and disposed in a region of the insulating layer corresponding to a non-display region of the array substrate; and the signal lines are disposed on inner walls of the grooves, a direction of the inner walls of the grooves is arranged such that at least a portion of light incident on the signal lines from a side of the first substrate facing away from the signal lines is reflected to a display region of the array substrate. Since the signal lines may reflect at least a portion of the light incident thereon to the display region of the array substrate, the backlight utilization rate and the panel transmittance may at least partially be improved to some extent.

In one embodiment, the array substrate is prepared by the method of the present disclosure includes steps of: forming an insulating layer on one side of a first substrate, and forming grooves on a side of the insulating layer facing away from the first substrate and in a region corresponding to a non-display region of the array substrate; forming signal lines on inner walls of the grooves, arranging a direction of the inner walls of the grooves such that at least a portion of light incident to the signal lines from a side of the first substrate facing away from the signal lines is reflected to a display region of the array substrate. Since the signal lines may reflect at least a portion of the light incident thereon to the display region of the array substrate, the backlight utilization rate and the panel transmittance may at least partially be improved to some extent.

It will be apparent to those skilled in the art that various modifications and changes may be made in the present disclosure without departing from the spirit and scope of the disclosure. Thus, it is intended that the present disclosure covers the modifications and the modifications.

What is claimed is:

1. An array substrate comprising:
   a first substrate, signal lines and an insulating layer;
   the insulating layer is disposed on the first substrate, and grooves are disposed on a side of the insulating layer facing away from the first substrate and disposed in a region of the insulating layer corresponding to a non-display region of the array substrate; and
   the signal lines are disposed on inner walls of the grooves, a direction of the inner walls of the grooves is arranged such that at least a portion of light incident on the signal lines from a side of the first substrate facing away from the signal lines is reflected to a display region of the array substrate.

2. The array substrate according to claim 1, wherein the signal lines comprises scan lines and data lines, the scan lines and the data lines being arranged to cross each other;
   the grooves comprise the first grooves and the second grooves;
   wherein the insulating layer comprises a first insulating layer and a second insulating layer stacked to each other:
   the first grooves are disposed on a side of the first insulating layer facing away from the first substrate and disposed in a region of the first insulating layer corresponding to a non-display region of the array substrate; and the scan lines are disposed on inner walls of the first grooves, a direction of the inner walls of the first grooves is arranged such that at least a portion of light incident on the scan lines from a side of the first substrate facing away from the scan lines is reflected to the display region of the array substrate; and
   the second grooves are disposed on a side of the second insulating layer facing away from the first substrate and disposed in a region of the second insulating layer corresponding to a non-display region of the array substrate; and the data lines are disposed on inner walls of the second grooves, a direction of the inner walls of the second grooves is arranged such that at least a portion of light incident on the data lines from a side of the first substrate facing away from the data lines is reflected to the display region of the array substrate.

3. The array substrate according to claim 1, wherein the signal lines cover the entire inner walls of the grooves.

4. The array substrate according to claim 1, wherein each of the inner walls of the grooves has a cross section of a substantial U or V shape.

5. The array substrate according to claim 4, wherein each of the grooves has a cross section of an isosceles triangle.

6. The array substrate according to claim 2, wherein each of the inner walls of the first grooves or the second grooves has a cross section of a substantial U or V shape.

7. The array substrate according to claim 6, wherein each of the first grooves or the second grooves has a cross section of an isosceles triangle.

8. A liquid crystal display panel, comprising:
the array substrate according to claim 1;
an opposite substrate aligned and assembled with the array substrate; and
a liquid crystal layer disposed between the array substrate and the opposite substrate.

9. The liquid crystal display panel according to claim 8, wherein the opposite substrate comprises: a second substrate, a black matrix layer disposed on a surface of the second substrate facing toward the array substrate and in a region corresponding to the non-display region of the array substrate; each of the grooves has a cross section of an isosceles triangle, and an apex angle of the isosceles triangle is $\theta_1$ which satisfies the following condition:

$$L_{1min}/d_{1max} < \tan \theta_1 < L_{1max}/d_{1min}$$

where $L_{1min}$ is a distance from a vertex of the apex angle of the isosceles triangle to a proximal end of an adjacent pixel unit; $L_{1max}$ is a distance from a vertex of a base angle of the isosceles triangle to a distal end the adjacent pixel unit on a same side as the vertex of the base angle; $d_{1min}$ is a distance from the vertex of the base angle of the isosceles triangle to the black matrix layer; $d_{1max}$ is a distance from the vertex of the apex angle of the isosceles triangle to the black matrix layer.

10. The liquid crystal display panel according to claim 8, wherein the opposite substrate comprises: a second substrate, a black matrix layer disposed on a surface of the second substrate facing toward the array substrate and in a region corresponding to the non-display region of the array substrate; each of the grooves has a cross section of an isosceles triangle, and the apex angle of the isosceles triangle is $\theta_1$ which satisfies the following condition:

$$L'_{1min}/d_{1min} < \tan \theta_1 < L'_{1max}/d_{1max}$$

where $L'_{1min}$ is a distance from a vertex of a base angle of the isosceles triangle to a proximal end of an adjacent pixel unit on a same side of the vertex of the base angle; $L'_{1max}$ is a distance from a vertex of the apex angle of the isosceles triangle to a distal end of the adjacent pixel unit; $d_{1min}$ is a distance from the vertex of the base angle of the isosceles triangle to the black matrix layer; $d_{1max}$ is a distance from the vertex of the apex angle of the isosceles triangle to the black matrix layer.

11. A display device, comprising the liquid crystal display panel according to claim 8.

12. A method for manufacturing an array substrate, comprising steps of:
forming an insulating layer on one side of a first substrate, and forming grooves on a side of the insulating layer facing away from the first substrate and in a region corresponding to a non-display region of the array substrate;
forming signal lines on inner walls of the grooves, arranging a direction of the inner walls of the grooves such that at least a portion of light incident to the signal lines from a side of the first substrate facing away from the signal lines is reflected to a display region of the array substrate.

13. The method according to claim 12, wherein the signal lines comprises scan lines and data lines, the scan lines and the data lines being arranged to cross each other; the grooves comprise the first grooves and the second grooves and the insulating layer comprises a first insulating layer and a second insulating layer stacked to each other; and
the method includes following steps:
forming a first insulating layer on one side of the first substrate, and forming first grooves on a side of the first insulating layer facing away from the first substrate and in a portion of the first insulating layer corresponding to the non-display region of the array substrate;
forming scan lines on inner walls of the first grooves, arranging a direction of inner walls of the first grooves such that at least a portion of light incident to the scan lines from a side of the first substrate facing away from the scan lines is reflected to a display region of the array substrate;
forming a second insulating layer on one side of the first insulating layer facing away from the first substrate, and forming second grooves on a side of the second insulating layer facing away from the first substrate and in a region corresponding to the non-display region of the array substrate; and
forming a data lines on inner walls of the second grooves, arranging a direction of inner walls of the second grooves such that at least a portion of light incident to the data lines from a side of the first substrate facing away from the data lines is reflected to the display region of the array substrate.

14. The method according to claim 12, wherein the step of forming an insulating layer on one side of the first substrate, and forming grooves on a side of the insulating layer facing away from the first substrate and in a region corresponding to a non-display region of the array substrate, comprises:
applying a negative photoresist on one side of the first substrate;
exposing and developing the negative photoresist with a halftone mask to form an insulating layer, and forming grooves on a side of the insulating layer facing away from the first substrate and in a portion of the insulating layer corresponding to the non-display region of the array substrate.

15. The method according to claim 13, wherein the step of forming a first insulating layer on one side of the first substrate, and forming first grooves on a side of the first insulating layer facing away from the first substrate and in a portion of the first insulating layer corresponding to the non-display region of the array substrate comprises:
applying a negative photoresist on one side of the first substrate;
exposing and developing the negative photoresist with a halftone mask to form a first insulating layer, and forming first grooves on a side of the first insulating layer facing away from the first substrate and in a portion of the first insulating layer corresponding to the non-display region of the array substrate.

16. The method according to claim 13, wherein the step of forming a second insulating layer on one side of the first insulating layer facing away from the first substrate, and forming second grooves on a side of the second insulating layer facing away from the first substrate and in a portion of the second insulating layer corresponding to the non-display region of the array substrate comprises:

applying a negative photoresist on one side of the first insulating layer facing away from the first substrate;

exposing and developing the negative photoresist with a halftone mask to form a second insulating layer, and forming second grooves on a side of the second insulating layer facing away from the first substrate and in a portion of the second insulating layer corresponding to the non-display region of the array substrate.

\* \* \* \* \*